United States Patent
Crane, Jr. et al.

(10) Patent No.: US 6,847,115 B2
(45) Date of Patent: Jan. 25, 2005

(54) PACKAGED SEMICONDUCTOR DEVICE FOR RADIO FREQUENCY SHIELDING

(75) Inventors: Stanford W. Crane, Jr., Santa Clara, CA (US); Myoung-Soo Jeon, Fremont, CA (US); Vicente D. Alcaria, Richmond, CA (US)

(73) Assignee: Silicon Bandwidth Inc., Fremont, CA (US)

( * ) Notice: Subject to any disclaimer, the term of this patent is extended or adjusted under 35 U.S.C. 154(b) by 0 days.

(21) Appl. No.: 09/946,553

(22) Filed: Sep. 6, 2001

(65) Prior Publication Data

US 2003/0042582 A1 Mar. 6, 2003

(51) Int. Cl.[7] .......................... H05K 9/00; H01L 29/04
(52) U.S. Cl. ...................... 257/728; 257/664; 257/659; 257/704; 257/710; 257/729; 257/730; 257/691; 257/698; 257/660; 257/787; 257/676; 257/675; 257/712; 257/713; 361/403; 361/424; 361/816; 361/818; 174/35 R
(58) Field of Search ............................... 257/728, 664, 257/659, 704, 710, 729, 730, 691, 698, 660, 787, 676, 675, 712, 713, 666, 725, 641, 640, 687, 672, 671, 674; 361/403, 424, 816, 818; 174/35 R (56) References Cited

U.S. PATENT DOCUMENTS

| | | | | |
|---|---|---|---|---|
| 4,370,515 A | * | 1/1983 | Donaldson | 174/35 R |
| 4,427,991 A | * | 1/1984 | Yamamura et al. | 257/664 |
| 4,455,448 A | * | 6/1984 | Bertolina | 174/35 R |
| 4,670,770 A | * | 6/1987 | Tai | 257/777 |
| 4,908,694 A | * | 3/1990 | Hidaka et al. | 257/664 |
| 5,008,213 A | * | 4/1991 | Kolesar, Jr. | 438/107 |
| 5,142,698 A | * | 8/1992 | Koga et al. | 455/327 |
| 5,151,769 A | * | 9/1992 | Immorlica et al. | 257/659 |
| 5,194,695 A | | 3/1993 | Maslakow | 257/678 |
| 5,248,901 A | | 9/1993 | Temple | 257/678 |
| 5,317,107 A | * | 5/1994 | Osorio | 257/659 |
| 5,350,713 A | | 9/1994 | Liang | |
| 5,406,630 A | * | 4/1995 | Piosenka et al. | 380/52 |
| 5,414,597 A | * | 5/1995 | Lindland et al. | 361/816 |
| 5,500,628 A | * | 3/1996 | Knecht | 331/68 |

(List continued on next page.)

FOREIGN PATENT DOCUMENTS

| | | | |
|---|---|---|---|
| JP | 8-46073 | * | 2/1996 |
| JP | 11-97972 | * | 4/1999 |
| JP | 2000-236045 | * | 8/2000 |

OTHER PUBLICATIONS

Patent application Ser. No. 09/946,682, filed Sep. 6, 2001, Crane, Jr., et al.

Patent application Ser. No. 09/946,554, filed Sep. 6, 2001, Crane, Jr., et al.

Patent application Ser. No. 09/940,649, filed Aug. 29, 2001, Crane, Jr., et al.

Primary Examiner—Alexander Oscar Williams
(74) Attorney, Agent, or Firm—McKenna Long & Aldridge LLP (57) ABSTRACT

A packaged semiconductor device that is fabricated with a plurality of conductive leads defined in a strip that beneficially includes a radio frequency shield box. The conductive contacts are located in a housing, beneficially by insert molding or by sandwiching between a bottom piece and a top piece. The housing can further include a cavity that receives a semiconductor device, and the radio frequency shield can receive another semiconductor device. Bonding conductors electrically connect at least one semiconductor device to another semiconductor device and/or to the conductive contacts. A conductive cover is disposed over the housing. The cavity beneficially includes a beveled wall and the conductive leads and the radio frequency shield are beneficially comprised of copper.

15 Claims, 9 Drawing Sheets

U.S. PATENT DOCUMENTS

| | | | | |
|---|---|---|---|---|
| 5,572,065 | A | 11/1996 | Burns | 257/666 |
| 5,574,314 | A * | 11/1996 | Okada et al. | 257/728 |
| 5,602,421 | A * | 2/1997 | Li | 257/728 |
| 5,650,659 | A * | 7/1997 | Mostafazadeh et al. | 257/660 |
| 5,939,784 | A * | 8/1999 | Glenn | 257/710 |
| 6,014,113 | A * | 1/2000 | Orchard et al. | 343/841 |
| 6,088,231 | A * | 7/2000 | Fajardo | 361/737 |
| 6,121,546 | A * | 9/2000 | Erickson et al. | 174/35 R |
| 6,227,724 | B1 | 5/2001 | Verdiell | 385/91 |
| 6,364,541 | B1 * | 4/2002 | Nesnidal et al. | 257/457 |
| 6,377,464 | B1 * | 4/2002 | Hashemi et al. | 257/713 |
| 6,410,847 | B1 * | 6/2002 | Allen et al. | 257/724 |
| 6,472,598 | B1 * | 10/2002 | Glenn | 174/52.2 |
| 2002/0008595 | A1 * | 1/2002 | Ohta et al. | 333/1.1 |

* cited by examiner

PACKAGED SEMICONDUCTOR DEVICE FOR RADIO FREQUENCY SHIELDING

BACKGROUND OF THE INVENTION

1. Field of the Invention

The present invention relates to semiconductor packages. More particularly, the present invention relates to semiconductor packages capable of incorporating radio frequency shielding.

2. Discussion of the Related Art

Modem electronic devices, for example cellular phones and pagers, require a seamless integration of analog and digital subsystems. Furthermore, premiums are often placed on small size, complexity, and high performance. Thus, sensitive analog circuits frequently need to be placed very close to high-speed digital systems.

High-speed digital systems can switch more then one hundred million times a second. At such switching speeds, switching currents tend to be high. Thus, such high-speed digital systems can radiate energy (noise) that interferes with sensitive analog circuits. Interference usually takes the form of signal crosstalk. While faraday shielding has been widely used to protect sensitive analog circuits from interference, the traditional faraday shields tend to be expensive. Furthermore, their implementation must be undertaken with great foresight to determine where to install the shields, and with great care to actually protect the analog circuits. Moreover, the traditional faraday shield is not particularly flexible.

Figure 1A:
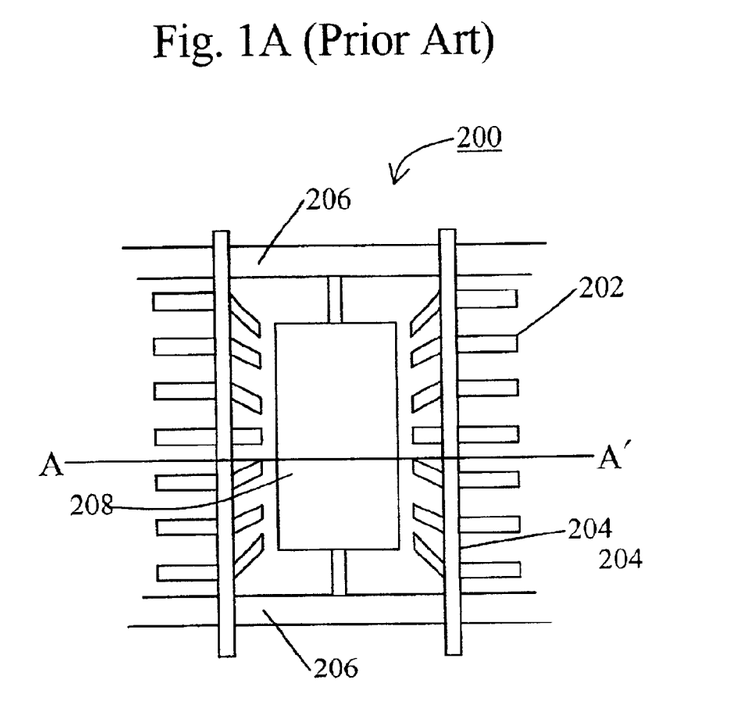
FIGS. 1A–1D illustrate a prior art semiconductor device.
Figure 1B:
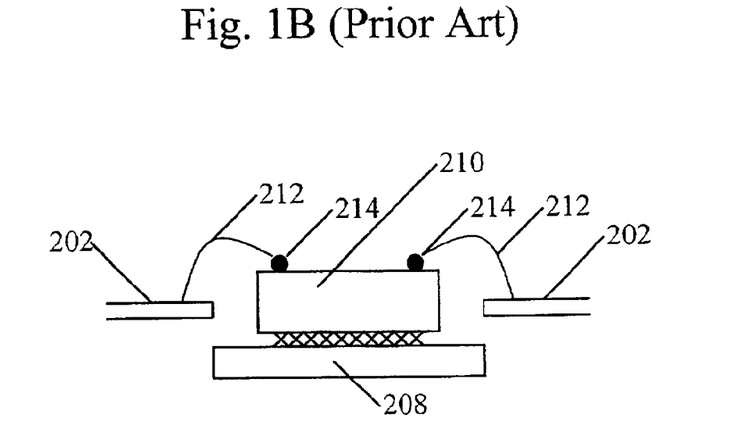
Figure 1C:
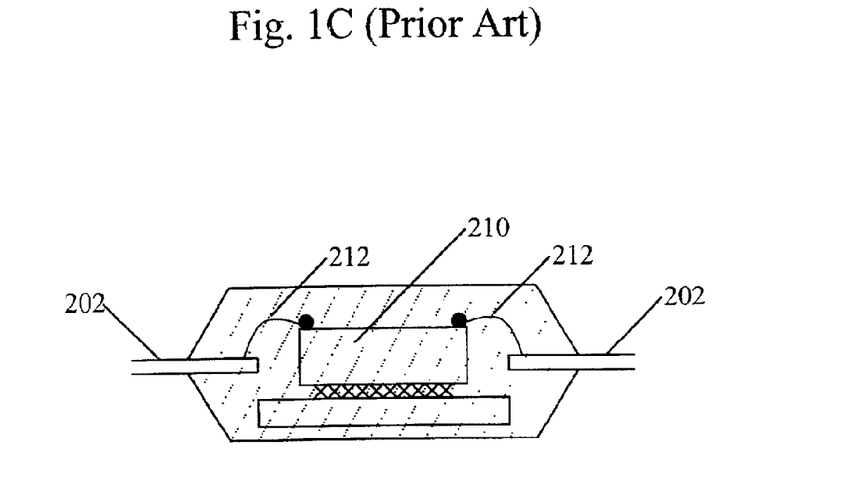
Figure 1D:
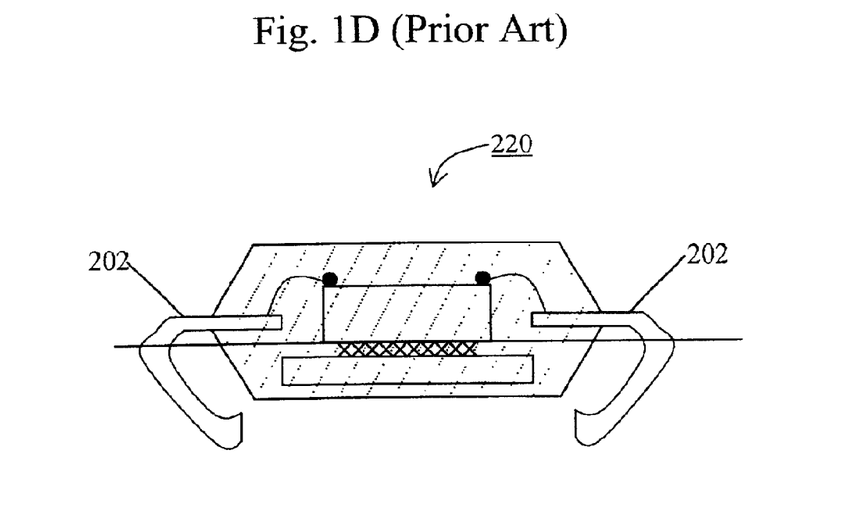

Traditionally, semiconductor devices are packaged in semiconductor packages having external leads for soldering, or otherwise connecting, to a printed circuit board. For example, dual in-line packages (DIP) and surface mount leadless chip packages have been widely used. In such packages a semiconductor die is encapsulated in ceramic or plastic. FIGS. 1A–1D illustrate a typical prior art semiconductor device. Referring now to FIG. 1A, the prior art semiconductor device includes a lead frame 200 that is usually stamped out of a metal strip. The lead frame includes a plurality of leads 202 held together by connectors 204 that extend between rails 206. The lead frame 200 further includes a mounting pad 208. Referring now to FIG. 1B, which shows a cut-away view along lines A—A of FIG. 1A after a semiconductor die (beneficially an integrated circuit) 210 is mounted on the mounting pad 208, bonding conductors or wires 212 extend from exposed electrical contacts 214 on the semiconductor die 210 to the leads 202. Typically the bonding conductors 212 are welded to the exposed electrical contacts 214 and to the electrical pads of the leads 202. Next, as shown in FIG. 1C, the lead frame 200, the semiconductor die 210, and the bonding conductors 212 are then encapsulated. Finally, as shown in FIG. 1D, the leads 202 are then cut and formed as required to complete the semiconductor device 220. While not specifically discussed, the rails 206 and the connectors 204 are separated from the pad 208 and the leads 202 at some time during assembly. The leads 202 enable electrical signals to travel to and from the semiconductor die to the external environment.

While prior art semiconductor packages have been successful, they are not without problems. First, as semiconductor devices are mounted closer and closer together, the problem of cross-talk increases. This is a significant problem with analog circuits that have high impedance levels since they are particularly sensitive to crosstalk. Prior art semiconductor packages usually do not provide electrical and electromagnetic isolation of their components. Furthermore, prior art semiconductor packages can be inconvenient and expensive because they require semiconductor manufacturers to not only have semiconductor fabrication equipment on site, but also both wire bonding and encapsulation equipment.

Therefore, a semiconductor package capable of providing electrical and electromagnetic isolation of a component mounted therein would be beneficial. Even more beneficial would be a semiconductor package that enables dense packaging of semiconductor components, together with electrical and electromagnetic isolation. Even more beneficial would be a low cost semiconductor package that enables dense packaging together with electrical and electromagnetic isolation of semiconductor components.

Also advantageous would be a semiconductor package that does not require on-site encapsulation of the semiconductor die. Even more beneficial would be a prefabricated semiconductor package.

SUMMARY OF THE INVENTION

Accordingly, the present invention is directed to a semiconductor package that substantially obviates one or more of the problems due to limitations and disadvantages of the related art.

The principles of the present invention provide for a semiconductor package that can be prefabricated and electrically shields a semiconductor chip.

The principles of the present invention also provide for a conductive strip used in forming a semiconductor package. The conductive strip includes a top rail having an extended tab with an end formed into an open box, a bottom rail, a connecting member that holds the top rail and the bottom rail together, and a plurality of elongated conductive contacts that extend from the connecting member. Beneficially, the conductive strip is integrally formed, such as by stamping. The conductive strip beneficially includes at least one hole in a rail for mating with automated machinery. To assist assembly of the conductive strip into a semiconductor package, the bottom rail can include an extended tab with a rectangular end.

The principles of the present invention further provide for a semiconductor package having radio frequency shielding of an integrated circuit. That semiconductor package includes a plurality of conductive contacts and a radio frequency shield. The conductive contacts and the radio frequency shield can be insert molded into a molded housing. Alternatively, the conductive contacts and the radio frequency shield can be sandwiched in a housing comprised of a top piece and a bottom piece. In either event, the conductive contacts extend from the inside to the outside of the semiconductor package. The semiconductor package further includes a first integrated circuit in the radio frequency shield. Beneficially, bonding wires electrically connect the first integrated circuit to at least a first of the conductive contacts. Even more beneficially, the semiconductor package further includes an internal cavity having a beveled wall and holding a second integrated circuit. Bonding conductors interconnect the first integrated circuit, the second integrated circuit, and the conductive contacts. The radio frequency shield can be electrically grounded via an elongated conductive contact. A conductive cover, beneficially of copper, is located over the top of the semiconductor package. The conductive contacts are formed as required.

The principles of the present invention also provide for a method of fabricating a semiconductor device having an RF shield. Such a method includes forming a conductive strip having a top rail with an extended tab that is connected to an open box. The conductive strip further includes a bottom rail, a connecting member attaching the top rail to the bottom rail, and a plurality of conductive contacts that extend from the connecting member. The method further includes forming the conductive strip into a housing, such as by insert molding or by sandwiching the conductive strip between a top piece and a bottom piece. The method also includes mounting a first semiconductor device in the open box, and electrically connecting the first semiconductor device to at least a first conductive contact. The method also includes forming the conductive contacts in a desired fashion, removing the connecting member, and removing the top rail and the bottom rail. Beneficially, the method further includes forming an internal cavity that receives a second semiconductor device. Then, the method further includes electrically connecting the second semiconductor device to a conductive contact or to the first semiconductor device. The method further includes installing a conductive cover over the top of the housing.

The principles of the present invention also provide for a method of fabricating a semiconductor package suitable for use with or without a radio frequency shield. Such a method includes forming a conductive strip having a top rail, a bottom rail, a connecting member attaching the top rail to the bottom rail, and a plurality of conductive contacts extending from the connecting member. The conductive strip is then insert molded into a housing having a molded hollow. If radio frequency shielding is desired a conductive box is inserted into the hollow. A first semiconductor device is then mounted in the hollow and electrically connected to at least a first conductive contact. The method also includes forming the conductive contacts in a desired fashion, removing the connecting member, and removing the top rail and the bottom rail. Beneficially, the method further includes forming a cavity that receives a second semiconductor device. In that case, the method includes electrically connecting the second semiconductor device to a conductive contact or to the first semiconductor device. The method further includes installing a cover over the top of the housing.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENT

The principles of the present invention are incorporated in an illustrated semiconductor device. It will be appreciated that while the illustrated semiconductor device displays enhanced properties, others who are skilled in the applicable arts will recognize numerous alternatives and variations. Therefore, the present invention is intended to extend to all alternatives and variations that come under the broad terms of the claims that follow.

Figure 2A:
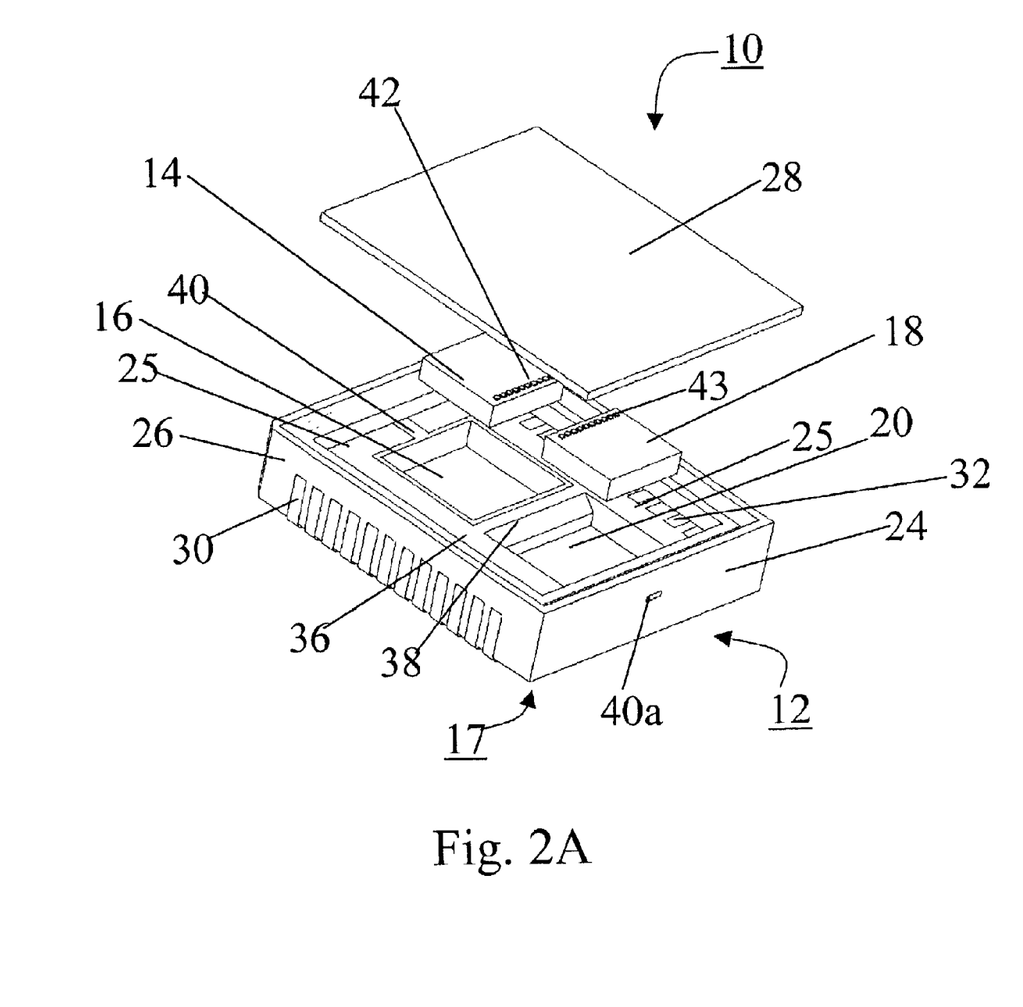
FIGS. 2A and 2B are exploded views of a semiconductor device comprised of mixed signal integrated circuits in a semiconductor package and that is in accord with the principles of the present invention.

FIG. 2A is an exploded view of a packaged semiconductor device 10 that includes mixed signal integrated circuits in a semiconductor package 12. An IC device such as a high-frequency RF analog integrated circuit 14 mounts in an RF shield 16 that preferably takes the form of a cavity or an open box, for example. A high-speed digital integrated circuit 18 mounts in a cavity 20. The semiconductor package 12 includes a generally rectangular shaped housing 17. Beneficially, housing 17 is a single molded piece having insert molded leads (see below) and an insert molded RF shield 16, as shown in FIG. 2A. Alternatively, the housing 17 can be fashioned from a top piece 22 and from a bottom piece 24 that interface along a dashed line 26, as shown in FIG. 2B.

Figure 2B:
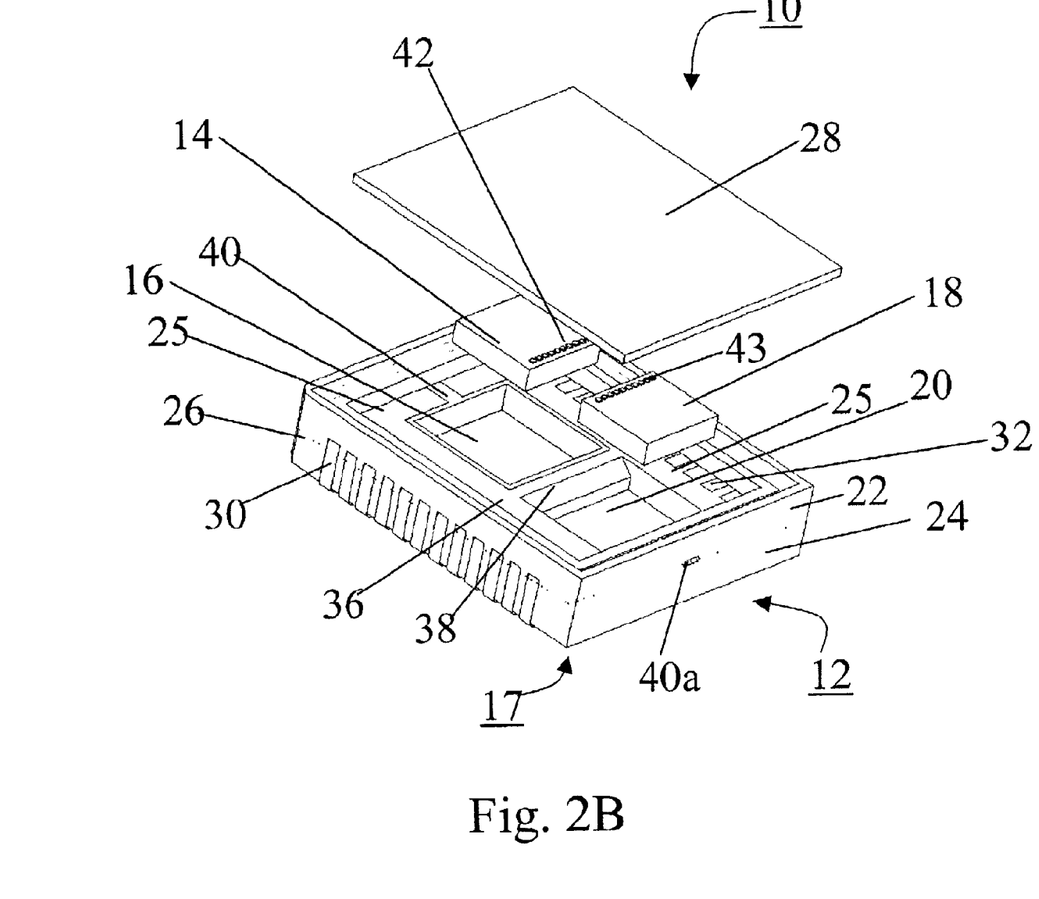

For both embodiments of FIGS. 2A and 2B, the housing has walls that define an upper surface that is dimensioned to receive a cover 28. The cover 28 is beneficially comprised of a conductive material such as copper.

Still referring to FIG. 2A, the semiconductor package 12 includes a plurality of conductive contacts 30 that extend out of the sides of the housing 17. If the housing 17 is a single molded piece (FIG. 2A) the conductive contacts 30 are beneficially insert molded such that they are arranged in their desired spatial relationship. While FIG. 2A shows a leadless carrier configuration, the conductive contacts 30 could also be fabricated in numerous other suitable configurations, such as in a dual-in line-package or a quad flat-pack.

Inside the semiconductor package 12, each conductive contact includes an exposed contact surface adjacent a housing wall 25. The exposed contact surfaces include bonding pads 32.

Still referring to FIG. 2A, the cavity 20 is beneficially molded into the housing 17. The housing also includes a hollow 36 that holds the RF shield 16. The wall 38 of the cavity 20 nearest the hollow 36 is beneficially beveled. Additionally, the housing includes channels that receive tabs (40 and 40a). The purpose of tabs 40 and 40a is explained subsequently. In one embodiment of the present invention, the RF shield 16 is insert molded into the housing 17. In another embodiment, the RF shield 16 is inserted into the hollow 36 after the housing 17 is formed. In other configurations contemplated by the present invention, the RF shield is not used or both the hollow and the cavity include RF shields. Furthermore, the channels that receive the tabs 40 and 40a are a result of insert molding of the tabs (see below).

When the packaged semiconductor device 10 is complete, bonding conductors 54 (see FIG. 6) connect the bonding pads 32 to pads 42 on the RF analog integrated circuit 14 and to pads 43 on the digital integrated circuit 18. Therefore, electrical signals can be transmitted to and from the integrated circuits via the conductive contacts 30. Furthermore, bonding conductors 53 (see FIG. 6) can interconnect pads 42 of the analog integrated circuit to pads 43 of the digital integrated circuit 18. Here, the beveled walls 38 beneficially minimizes the height of the bonding conductors. Thus, electrical signals can pass between the analog and the digital integrated circuits. Additionally, the analog integrated circuit 14 is beneficially shielded by the RF shield 16 from noise generated by the digital integrated circuit 18, for example. If desired, a bonding conductor can connect the RF shield 16 to a grounded bonding pad 32. Finally, a sealant such as epoxy between the upper surface 80 of the housing 17 and the cover 28 seals the packaged semiconductor device 10.

Figure 3:
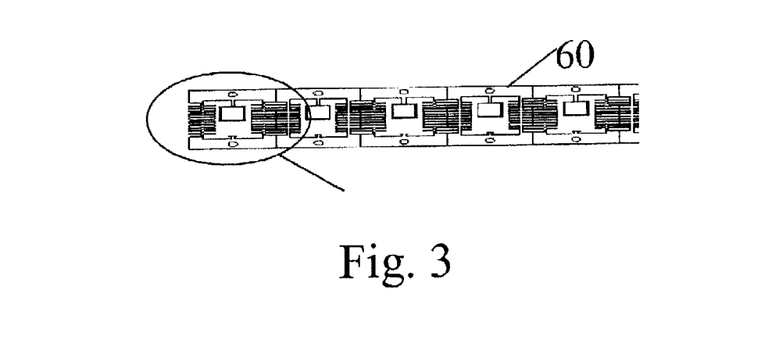
FIG. 3 is top down view of a pattern strip used in producing the semiconductor package of FIG. 2.

Turning now to FIG. 3, the semiconductor package 12 include the use of a pattern strip 60. The pattern strip 60 is beneficially an integral structure formed by stamping a suitable metal, such as copper or copper alloy. The pattern strip 60 is comprised of a continuous sequence of interconnected strips. A single strip 62 is shown in FIG. 4.

Figure 4:
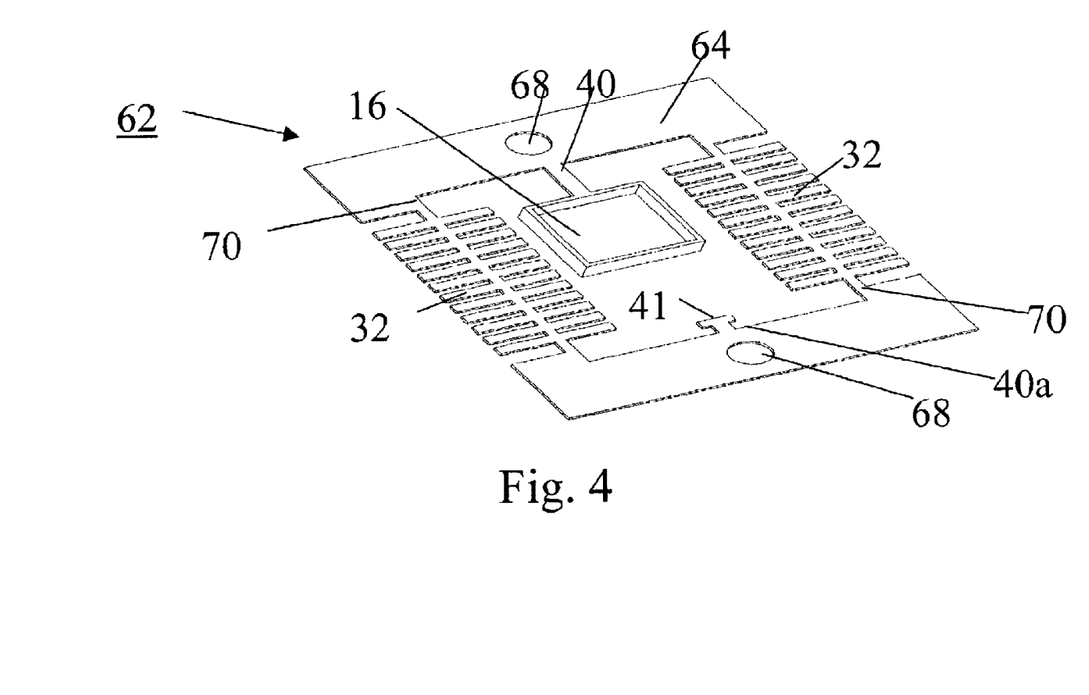
FIG. 4 is a perspective view of a single strip of the pattern strip shown in FIG. 3.

Referring now to FIG. 4, the strip 62 includes a top rail 64 and a bottom rail 66. Each rail beneficially includes a hole 68 that is used by a machine to advance the pattern strip 60 during fabrication of the semiconductor device 10. Extending inward from the top tab 40 is an open box that forms the RF shield 16. A second tab 40a, having a rectangular end 41, extends inward from the bottom rail 66. The tab 40 and the tab 40a fit into the channels of the housing 17 described above. The tabs are useful for aligning the strip during insert molding. The strip 62 further includes the plurality of conductive contacts 30. All of the components of the strip 62 are held together by connecting members 70 such that the strip 62 is relatively rigid.

Figure 5:
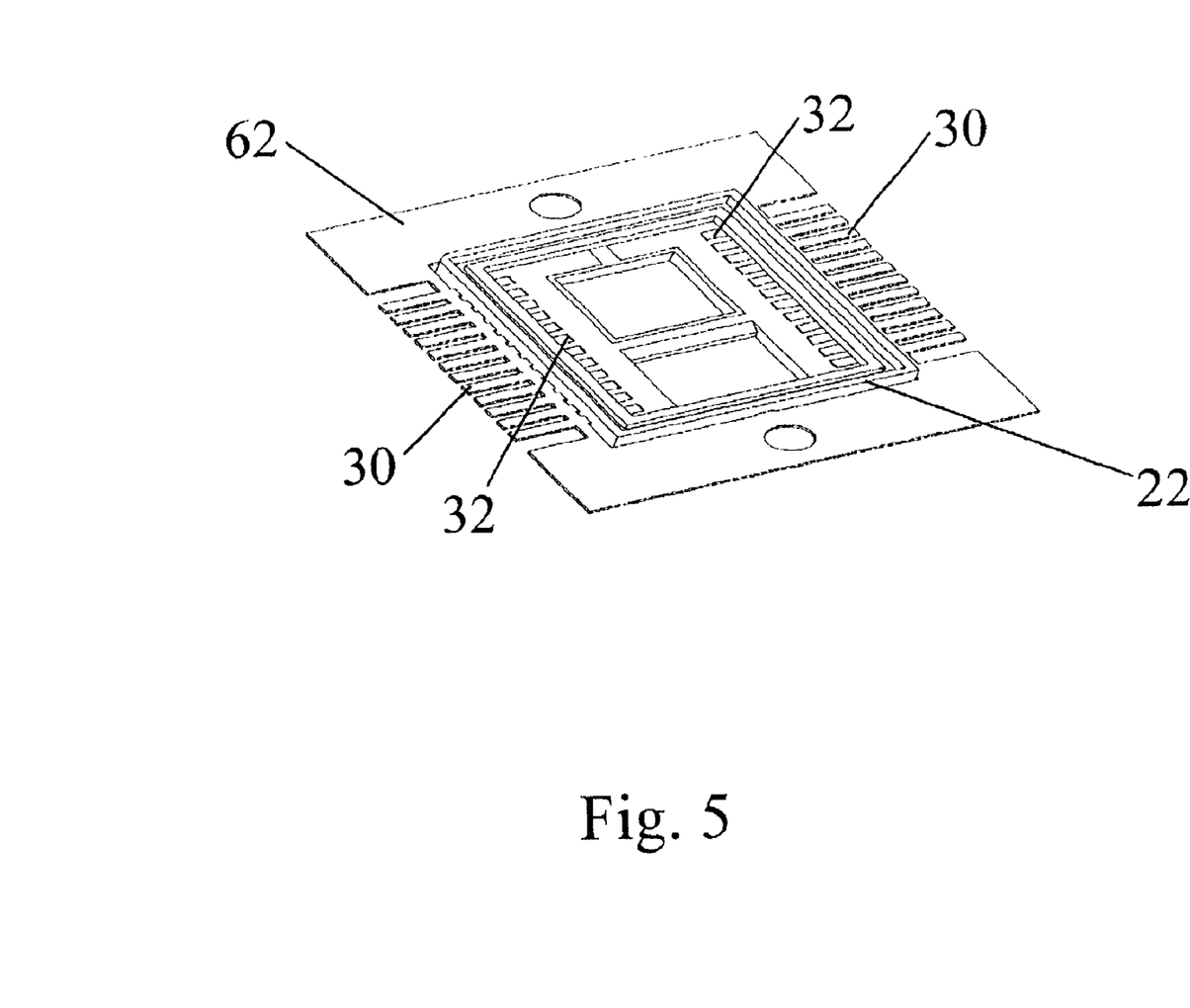
FIG. 5 is a perspective view of the strip illustrated in FIG. 4 in a housing.

Turning now to FIG. 5, fabrication of the semiconductor package 12 beneficially proceeds by inserting the strip 62 into a mold. Then, the strip 62 is insert molded into a housing 17 to form the semiconductor package 12. Molding can be performed in a number of different ways. For example, molding can be performed such that the connecting members 70 are external to the housing after molding. In that case, the conductive leads 30 can be formed in their desired orientation and the connecting members can then be cut off. Alternatively, the conductive leads 30 can be formed in their desired orientation and the connecting member cut off prior to molding. Of course there are numerous suitable molding alternatives.

Another approach to fabricating the semiconductor package 12 other than using insert molding is to sandwich the strip 62 between a top piece 22 and a bottom piece 24 (see FIG. 2B) such that the tabs 40 and 40a align with and mate into openings of the top piece and the bottom piece. The tabs then help register the top piece 22 and the bottom piece 24 to each other and with the strip 62.

With either approach to fabricating the semiconductor package 12 it is beneficial to include a molded cavity 20 and/or a molded hollow 36 that receive semiconductor chips. Of course, multiple cavities and hollows can be included as required.

After the semiconductor package 12 is fabricated the package is ready to receive the semiconductor devices in the cavity 20 and the hollow 36. The semiconductor package 12 can be fabricated at one location, stored, and then shipped to another location for receiving semiconductor devices to complete the semiconductor device 10. This enables a manufacturer to purchase the semiconductor packages and semiconductor chips separately, and then fabricate a completed device, if desired.

Figure 6:
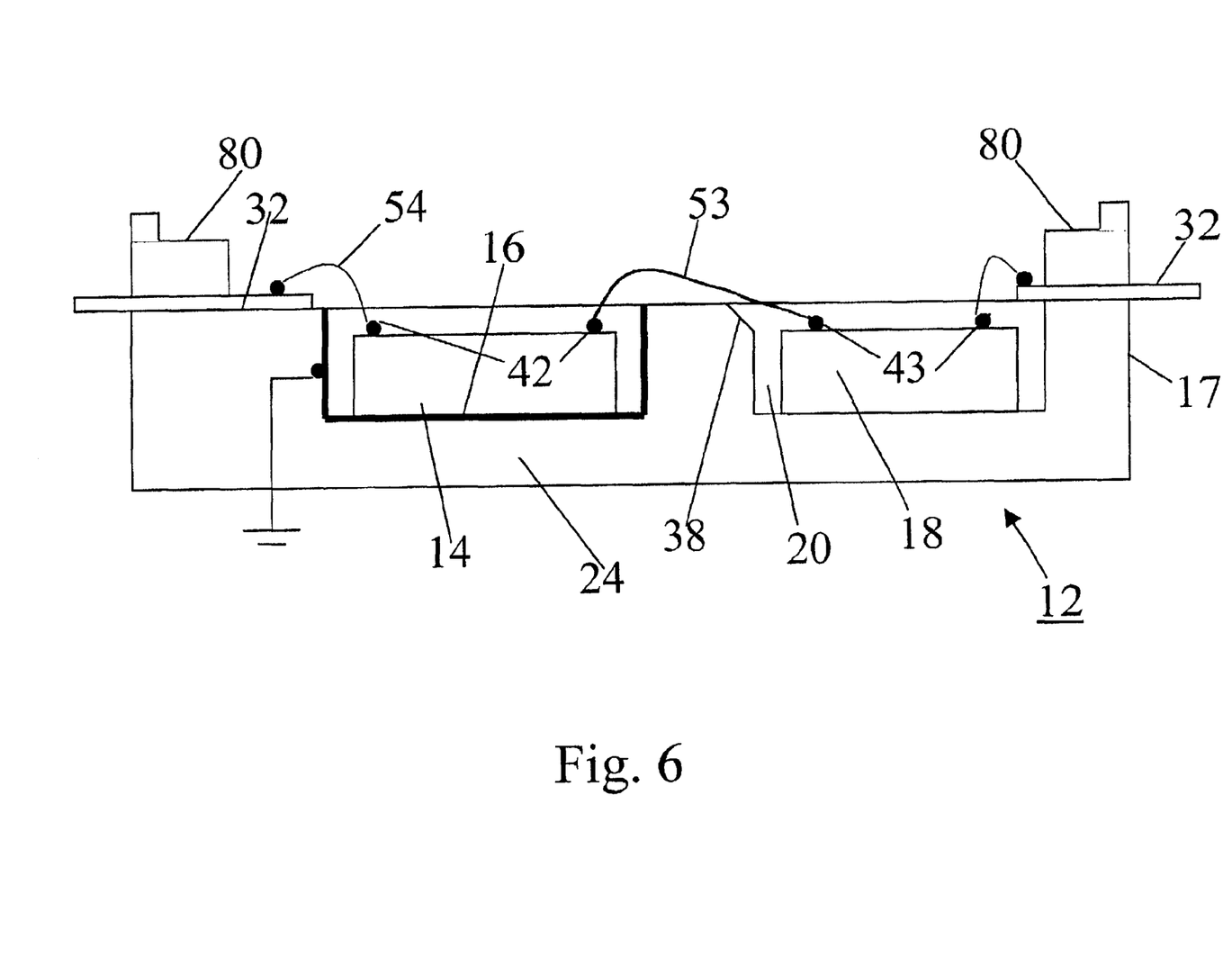
FIG. 6 is a schematic view of an analog integrated circuit and a digital integrated circuit mounted and electrically interconnected in the structure shown in FIG. 5.

FIG. 6 illustrates electrical connections to semiconductor chips mounted in a semiconductor package 12. Bonding conductors 53 electrically connect bonding pads 42 of the analog circuit 14 with bonding pads 43 of the digital circuit 18. As previously described, the housing 17 preferably includes the beveled wall 38. The beveled wall 38 enables bonding conductors 53 leave the cavity 20 at a shallow angle without contacting a sharp corner. The shallow angle is beneficial in that the bonding conductors 53 do not rise so far above the bottom piece 24 that they interfere with the cover 28 when it is in place. Furthermore, the beveled wall 38 avoids wire damage and sharp bends as the bonding conductors 53 enter the RF shield 16.

Still referring to FIG. 6, other bonding conductors 54 electrically connect bonding pads 42 and 43 to the bonding pads 32. This enables electrical signals to transmit to and from analog circuit 14 and the digital circuit 18 via the conductive contacts 30. The bonding conductors 53 and 54 are beneficially short and maintain generally parallel configurations. This minimizes parasitic capacitance and reflections. The bonding conductors are preferably wires or ribbons.

Figure 7:
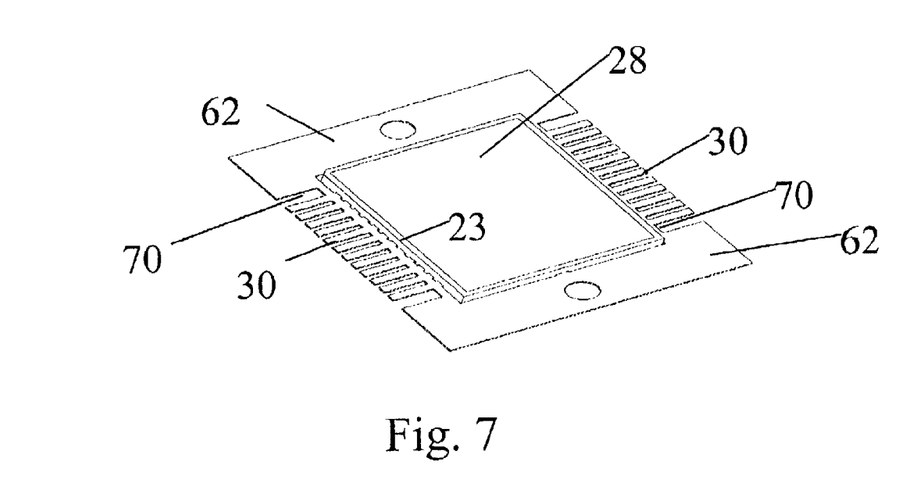
FIG. 7 is a perspective view of a cover attached to the structure shown in FIG. 6.

Referring to FIG. 7, after the bonding wires are installed, the cover 28 is placed over the top of the housing 17. Referring now back to FIG. 6, the cover 28 rests on a wall surface 80 fabricated such that the cover 28 does not contact the bonding wires 53 and 54. A sealant, such as an epoxy, is located between the surface 80 and the cover 28 to provide an environmental seal. The sealant can also be placed on the bonding pads 32 as required.

Figure 8:
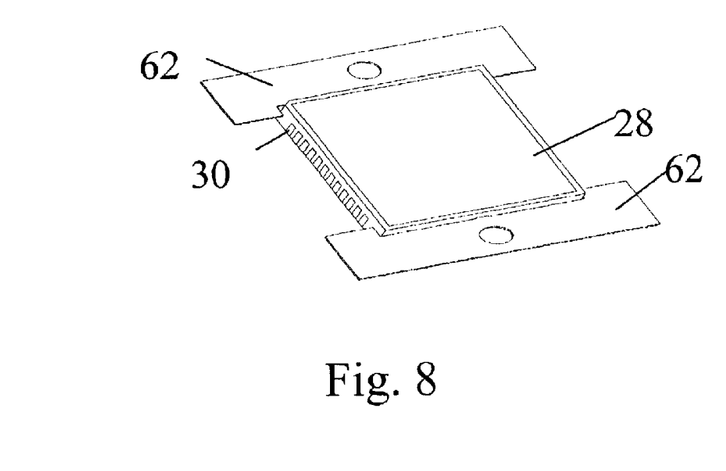
FIG. 8 is a perspective view of the structure illustrated in FIG. 7 after the strip leads are formed in place.

Referring to FIG. 8, if the conductive contacts 30 were not molded into place before insert molding, the conductive contacts 30 are formed into position and the connecting members 70 are cut off. The housing 17 may include channels that receive the conductive contacts 30 when the conductive contacts are formed into position.

Figure 9:
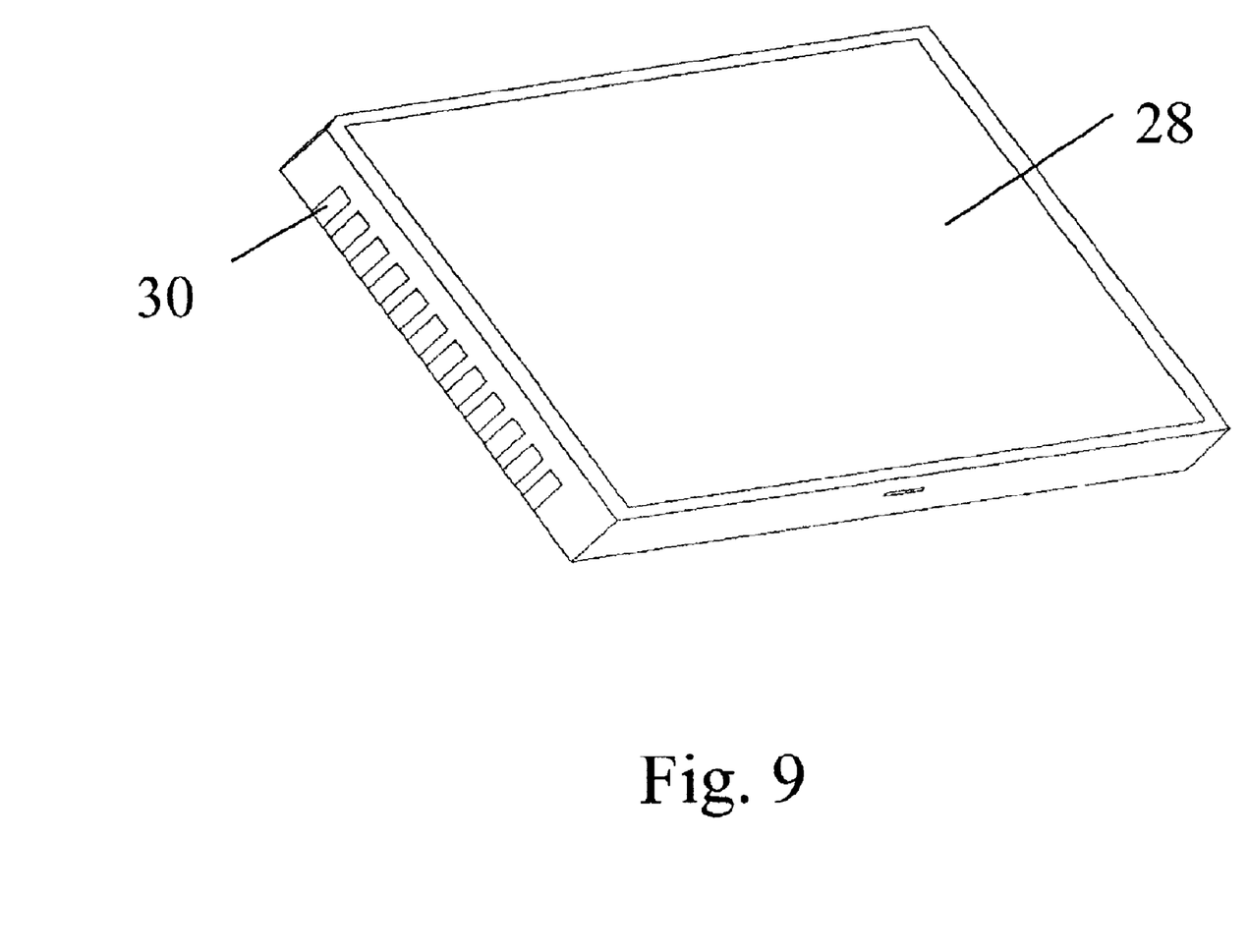
FIG. 9 is a perspective view of the semiconductor device illustrated in FIG. 8 after the rails are cut to form a packaged semiconductor device.

Next, as shown in FIG. 9, the rails 62 are trimmed off. This completes the packaged semiconductor device 10. Trimming the rails off late in the fabrication of the packaged semiconductor device 10 is beneficial in the semiconductor devices can be continuously fabricated using the continuous pattern strip 60 shown in FIG. 3.

The foregoing has illustrated a novel packaged semiconductor device that has various mechanical, electrical, and fabrication advantages. However, those who are skilled in the applicable arts will recognize numerous additions, variations, and modifications. Therefore, it is to be understood that even though numerous characteristics and advantages of the invention have been set forth, or are obvious to those skilled in the applicable arts, the disclosure is illustrative only and that changes may be made in details. Therefore, the present invention is meant to cover all embodiments that fall within the broad meaning of the following claims.

What is claimed is:

1. A semiconductor device package having first and second integrated circuits, comprising:
   a housing having a hollow;
   first and second cavities beneath said hollow, wherein said first and second integrated circuits are located in said first and second cavities, respectively;
   a radio frequency shield located in said first cavity;
   a plurality of conductive contacts in said housing that pass from inside said housing to outside said housing; and
   a cover over said housing.

2. A semiconductor device according to claim 1, wherein said cover is conductive.

3. A semiconductor device according to claim 1, wherein said radio frequency shield is electrically grounded.

4. A semiconductor device according to claim 1, further including a bonding connector electrically connecting said first integrated circuit to a conductive contact.

5. A semiconductor device according to claim 1, wherein said housing further includes a cavity holding said second integrated circuit.

6. A semiconductor device according to claim 5, further including a second bonding connector electrically connecting said second integrated circuit to said first integrated circuit.

7. A semiconductor device according to claim 6, further including a third bonding connector electrically connecting said second integrated circuit to a conductive contact.

8. A semiconductor device according to claim 5, wherein said cavity is a molded cavity, and wherein said molded cavity includes a beveled wall.

9. A semiconductor device according to claim 1, wherein said first integrated circuit includes analog components.

10. A semiconductor device according to claim 5, wherein said second integrated circuit includes a digital circuit.

11. A semiconductor device according to claim 1, wherein said plurality of conductive contacts are insert molded into said housing.

12. A semiconductor device according to claim 11, wherein said RF shield is insert molded into said housing.

13. A semiconductor device according to claim 1, wherein said cover includes copper.

14. A semiconductor device according to claim 1, wherein said plurality of conductive contacts include copper.

15. A semiconductor device comprising:
an integrated circuit;
a housing having a hollow;
a cavity beneath said hollow, wherein the cavity includes a beveled wall, and wherein said integrated circuit is mounted in the cavity;
a bonding conductor electrically connected to said integrated circuit, wherein said bonding conductor passes over the beveled wall; and
a cover over said housing.

* * * * *